(12) United States Patent
Chung et al.

(10) Patent No.: US 7,851,256 B2
(45) Date of Patent: Dec. 14, 2010

(54) METHOD OF MANUFACTURING CHIP-ON-CHIP SEMICONDUCTOR DEVICE

(75) Inventors: Hyun-soo Chung, Hwaseong-si (KR); Dong-ho Lee, Seongnam-si (KR); Seong-deok Hwang, Seoul (KR); Sun-won Kang, Seoul (KR); Seung-duk Baek, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/285,923

(22) Filed: Oct. 16, 2008

(65) Prior Publication Data

US 2009/0111217 A1 Apr. 30, 2009

(30) Foreign Application Priority Data

Oct. 25, 2007 (KR) .................... 10-2007-0107817

(51) Int. Cl.
*H01L 23/48* (2006.01)
*H01L 23/52* (2006.01)
(52) U.S. Cl. .................. 438/107; 438/109; 438/612; 438/613; 257/777; 257/E29.169; 257/E23.142
(58) Field of Classification Search ............. 438/109, 438/106, 107, 108, 612, 613; 257/777, 737, 257/678, 734, 784, E23.169, E23.142
See application file for complete search history.

(56) References Cited

U.S. PATENT DOCUMENTS

| | | | |
|---|---|---|---|
| 5,229,647 A * | 7/1993 | Gnadinger | 257/785 |
| 6,010,769 A * | 1/2000 | Sasaoka et al. | 428/209 |
| 6,156,408 A * | 12/2000 | Zhou et al. | 428/131 |
| 6,621,164 B2 * | 9/2003 | Hwang et al. | 257/738 |
| 6,622,905 B2 * | 9/2003 | Shier et al. | 228/180.22 |
| 2004/0212083 A1 * | 10/2004 | Yang | 257/723 |
| 2005/0263869 A1 * | 12/2005 | Tanaka et al. | 257/686 |
| 2006/0249826 A1 * | 11/2006 | Foong et al. | 257/685 |
| 2008/0157357 A1 * | 7/2008 | Kim et al. | 257/737 |
| 2008/0248611 A1 * | 10/2008 | Hanada et al. | 438/108 |

FOREIGN PATENT DOCUMENTS

| | | |
|---|---|---|
| JP | 2005-340389 | 12/2005 |
| KR | 10-2001-0029196 | 4/2001 |
| KR | 10-2003-0002832 | 1/2003 |

\* cited by examiner

*Primary Examiner*—Matthew S Smith
*Assistant Examiner*—Michele Fan
(74) *Attorney, Agent, or Firm*—Harness, Dickey & Pierce P.L.C.

(57) ABSTRACT

Provided is a method of fabricating a chip-on-chip (COC) semiconductor device. The method of fabricating a chip-on-chip (COC) semiconductor device may include preparing a first semiconductor device with a metal wiring having at least one discontinuous spot formed therein, preparing a second semiconductor device with at least one bump formed on a surface of the second semiconductor device corresponding to the at least one discontinuous spot, aligning the first semiconductor device onto the second semiconductor device, and connecting the at least one bump of the second semiconductor device to the at least one discontinuous spot formed in the metal wiring of the first semiconductor device.

21 Claims, 7 Drawing Sheets

METHOD OF MANUFACTURING CHIP-ON-CHIP SEMICONDUCTOR DEVICE

PRIORITY STATEMENT

This application claims priority under 35 U.S.C. §119 to Korean Patent Application No. 10-2007-0107817, filed on Oct. 25, 2007, in the Korean Intellectual Property Office (KIPO), the entire contents of which are herein incorporated by reference.

BACKGROUND

1. Field

Example embodiments relate to a method of fabricating a semiconductor device, and more particularly, to a method of fabricating a chip-on-chip (COC) semiconductor device.

2. Description of the Related Art

Semiconductor packages having reduced weight and thickness and improved electrical performance are desired in light of the growing use of small-sized electronic devices, e.g., cellular phones and digital cameras. To achieve this, research has been conducted on semiconductor packages having a wiring structure formed through semiconductor chips that are stacked in a vertical direction.

Because a semiconductor package having a wiring structure formed through the semiconductor chips does not include a gold wire for connecting the semiconductor chips to each other, a signal may be transmitted at high speed, thereby increasing the operational frequency of the semiconductor package. In addition, the power consumption and the size of the semiconductor package may be reduced.

SUMMARY

Example embodiments provide a semiconductor device and a method of fabricating the same. In particular, example embodiments provide for a chip-on-chip (COC) semiconductor device having improved reliability of the electrical connection by preventing or reducing damages that might occur when connecting upper and lower stacked semiconductor devices to each other by virtue of a small-sized bump.

According to example embodiments, a method of fabricating a chip-on-chip (COC) semiconductor device may include preparing a first semiconductor device with a metal wiring having at least one discontinuous spot formed therein, preparing a second semiconductor device with at least one bump formed on a surface of the second semiconductor device corresponding to the at least one discontinuous spot, aligning the first semiconductor device onto the second semiconductor device, and connecting the at least one bump of the second semiconductor device to the at least one discontinuous spot formed in the metal wiring of the first semiconductor device.

According to example embodiments, a chip-on-chip (COC) semiconductor device may include a first semiconductor device with a metal wiring having at least one discontinuous spot formed therein and a second semiconductor device with at least one bump on a surface of the second semiconductor device, wherein the at least one bump is connected to the at least one discontinuous spot.

BRIEF DESCRIPTION OF THE DRAWINGS

Example embodiments will be more clearly understood from the following detailed description taken in conjunction with the accompanying drawings. FIGS. 1A-6 represent non-limiting, example embodiments as described herein.

DETAILED DESCRIPTION OF EXAMPLE EMBODIMENTS

Example embodiments will now be described more fully with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 1A:
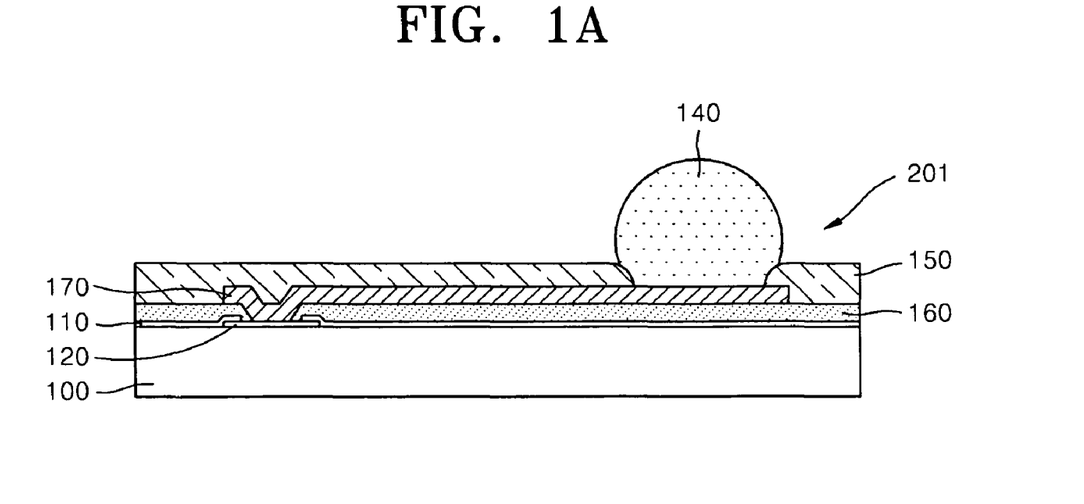
FIGS. 1A through 1D are cross-sectional views for describing a method of manufacturing a chip-on-chip (COC) semiconductor device, according to example embodiments.

FIGS. 1A through 1D are cross-sectional views for describing a method of manufacturing a chip-on-chip (COC) semiconductor device, according to example embodiments. FIG. 1A is a cross-sectional view of a second semiconductor device 201 manufactured using a method according to example embodiments. Referring to FIG. 1A, the second semiconductor device 201 may be a wafer or a semiconductor chip. A surface of a semiconductor substrate 100 may be covered with a passivation layer 110 so as to expose only a bond pad 120 thereon, and a first insulating layer 160 may be deposited on an entire surface of the passivation layer 110. The first insulating layer 160 may be patterned to expose the bond pad 120. A metal wiring, for example, a pad-rearrangement pattern 170, may be formed on the first insulating layer 160, and a second insulating layer 150 may be deposited on the pad-rearrangement pattern 170.

Figure 6:
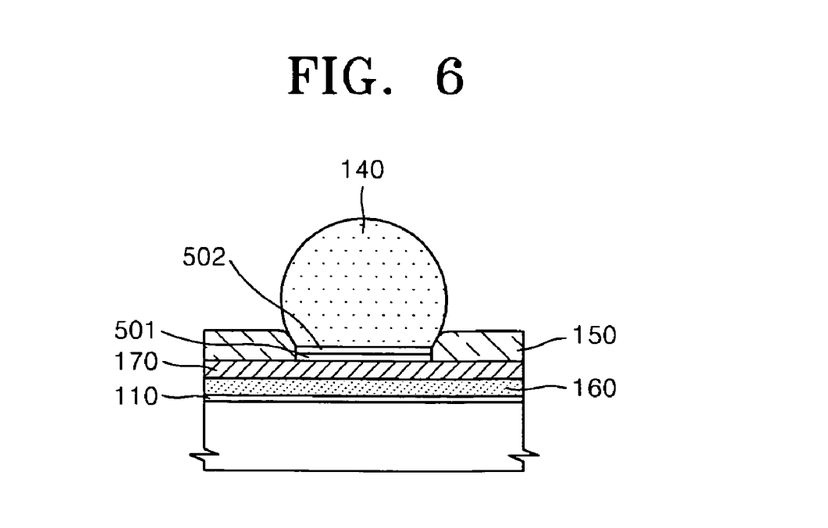
FIG. 6, is a cross-sectional view for describing a bump pad, according to example embodiments.

A part of the second insulating layer 150 may be etched so as to expose a part of the pad-rearrangement pattern 170, thereby forming a bump pad to which a bump 140 may be attached. An under bump metal (UBM) layer 501 (see FIG. 6) may be formed on the bump pad by using a conventional method. A seed layer 502 (see FIG. 6) may be selectively formed on the UBM layer using sputtering or deposition. The bump 140 may be attached to the seed layer using plating, jetting, or printing. The bump 140 may be formed using a method that is well known to one of ordinary skill in the art, and the method may be variously changed.

Figure 1B:
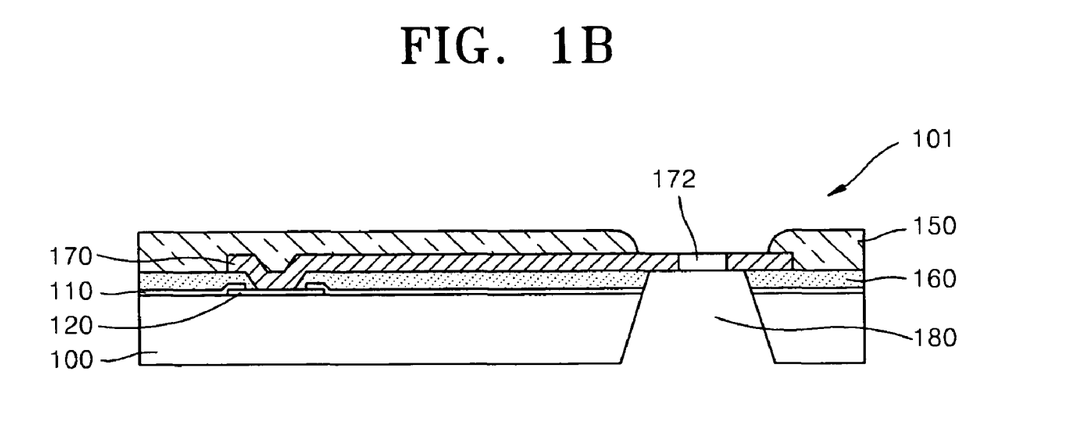

FIG. 1B is a cross-sectional view of a first semiconductor device 101 manufactured using a method according to example embodiments. Referring to FIG. 1B, the first semiconductor device 101 may be a wafer or a semiconductor chip. With regard to the configuration and manufacturing method of the first semiconductor device 101, a surface of a semiconductor substrate 100 may be covered with a passivation layer 110 so as to expose only a bond pad 120 thereon, and a first insulating layer 160 may be deposited on the passivation layer 110.

The first insulating layer 160 may be patterned to expose the bond pad 120, and a pad-rearrangement pattern 170 may be formed of a conductive material on the first insulating layer 160. The pad-rearrangement pattern 170 may be formed to have a discontinuous spot 172 therein. The electrical connection of the pad-rearrangement pattern 170 having the discontinuous spot 172 may be completed by the bump 140 of the second semiconductor device 201 in the following operation. The second insulating layer 150 may be deposited on the pad-rearrangement pattern 170 having the discontinuous spot 172, thereby exposing a part of the pad-rearrangement pattern 170, in which the discontinuous spot 172 may be formed.

The first semiconductor device 101 may be relatively thin, e.g., about 100 μm or less, due to grinding a bottom surface of the semiconductor substrate 100. Then, a part of the semiconductor substrate 100, which corresponds to a region of the discontinuous spot 172, may be etched, thereby forming a recess region 180 exposing the discontinuous spot 172. The recess region 180 may be, for example, formed on an edge of the bond pad 120 or a scribe line of the wafer, however, example embodiments are not limited thereto. In addition, the recess region 180 may be etched by various processes. For example, the recess region may be etched using dry etching, e.g., reactive ion etching (RIE), wet etching, or laser etching.

In example embodiments, the recess region 180 may be formed to be greater than the discontinuous spot 172 formed in the pad-rearrangement pattern 170 because the reliability of electrical connection of the COC semiconductor device may be improved when the COC semiconductor device is manufactured by stacking the first and second semiconductor devices 101 and 201. The recess region 180 may have various shapes, e.g., rectangular, conic, or cylindrical, so that the recess region 180 may be self-aligned with the bump 140 when the bump 140 of the second semiconductor device 201 is plugged into the recess region 180.

An insulating layer having desirable dielectric characteristics may be selectively formed on side surfaces of the semiconductor substrate 100, which are exposed by the recess region 180, by using sputtering, chemical vapor deposition (CVD), or coating, in order to insulate the side surfaces of the semiconductor substrate 100 from the bump 140 of the second semiconductor device 201.

Figure 1C:
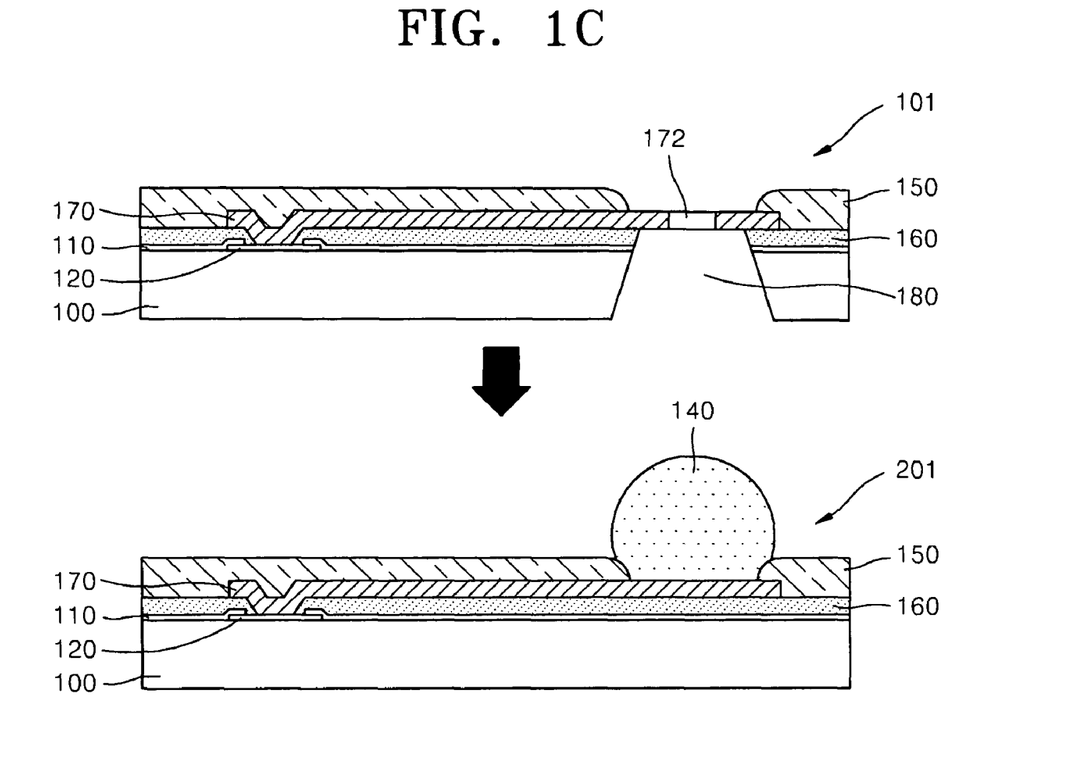

Referring to FIG. 1C, the second semiconductor device 201 including the bump 140 may be positioned below a wafer aligner, and the first semiconductor device 101 including the discontinuous spot 172 and the recess region 180 may be aligned with the second semiconductor device 201 above the wafer aligner. The bump 140 of the second semiconductor device 201 may be plugged into the recess region 180 of the first semiconductor device 101 by using eutectic bonding, thereby completing the manufacture of the COC semiconductor device including the first and second semiconductor devices 101 and 201 that are stacked in a vertical direction. Because the bump 140 may be plugged into the recess region 180, the electrical connection of the pad-rearrangement pattern 170 having the discontinuous spot 172 formed therein may be completed by the bump 140 of the second semiconductor device 201.

Figure 1D:
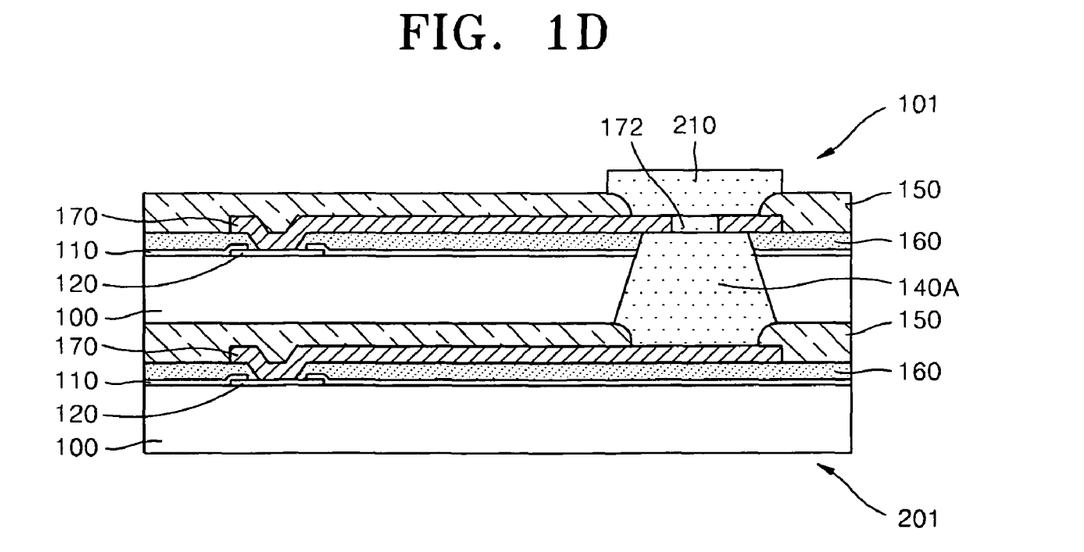

FIG. 1D is a cross-sectional view of the first semiconductor device 101 and the second semiconductor device 201 that are coupled using the eutectic bonding. In example embodiments, the bump 140 attached on the second semiconductor device 201 may be melted so as to completely fill the recess region 180 formed in the first semiconductor device 101. A part of a bump 140A, which is melted, may pass through the discontinuous spot 172 of the pad-rearrangement pattern 170 of the first semiconductor device 101 and may expand, thereby forming an additional bump pad 210. Thus, the bump 140A of the second semiconductor device 201 may be completely inserted into the recess region 180. Accordingly, the entire height of the COC semiconductor device may be reduced, and the reliability of the electrical connection of the COC semiconductor device may be improved during coupling of the first and second semiconductor devices 101 and 201. In addition, mechanical/electrical damages, which might occur at interconnection parts, may be reduced compared with a semiconductor package in which upper and lower semiconductor devices are coupled by a bump formed in a protruding shape without inserting the bump. In addition, solder joint reliability (SJR) may be improved due to the thermal expansion coefficient difference between the bump 140A and the semiconductor substrate 100 on the interface between the bump 140A and the semiconductor substrate 100.

According to example embodiments, because the thickness of the COC semiconductor device may be reduced by as much as the height of the bump 140A, a semiconductor chip module including relatively many semiconductor chips stacked therein may be embodied in a semiconductor package when the first and second semiconductor devices 101 and 201 perform the same function. When the first and second semiconductor devices 101 and 102 perform different functions, a system-in-package (SIP) including relatively many chips stacked therein may be embodied.

Figure 2:
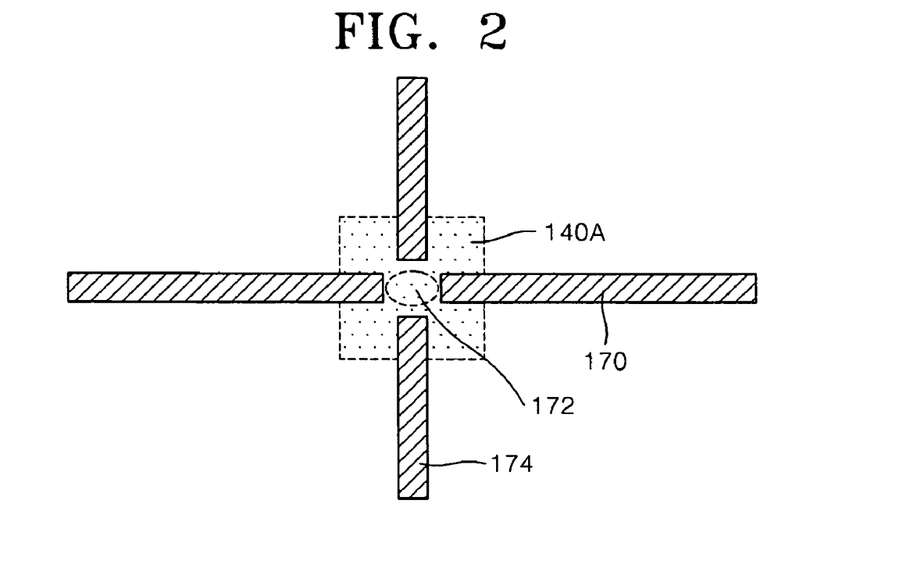
FIG. 2 is a plan view for describing the connection between a bump of a second semiconductor device and a recess region of a first semiconductor device, which are illustrated in FIG. 1D.

FIG. 2 is a plan view for describing the connection between the bump 140A of the second semiconductor device 201 and the recess region 180 of the first semiconductor device 101 illustrated in FIG. 1D. In particular, FIG. 2 is a plan view of a part of the semiconductor substrate 100, on which the pad-rearrangement pattern 170 of the first semiconductor device 101 may be formed, which is illustrated in FIG. 1D. Referring to FIG. 2, the pad-rearrangement pattern 170 having the discontinuous spot 172 formed therein may be completely connected by the bump 140A filling the recess region 180 of the first semiconductor device 101. To ensure the improved reliability of electrical connection at interconnection parts of the first and second semiconductor devices 101 and 102, a dummy pattern 174 formed of a conductive material may be further formed, and the thickness of the pad-rearrangement pattern 170 may be increased by about 10 μm if necessary.

Figure 3A:
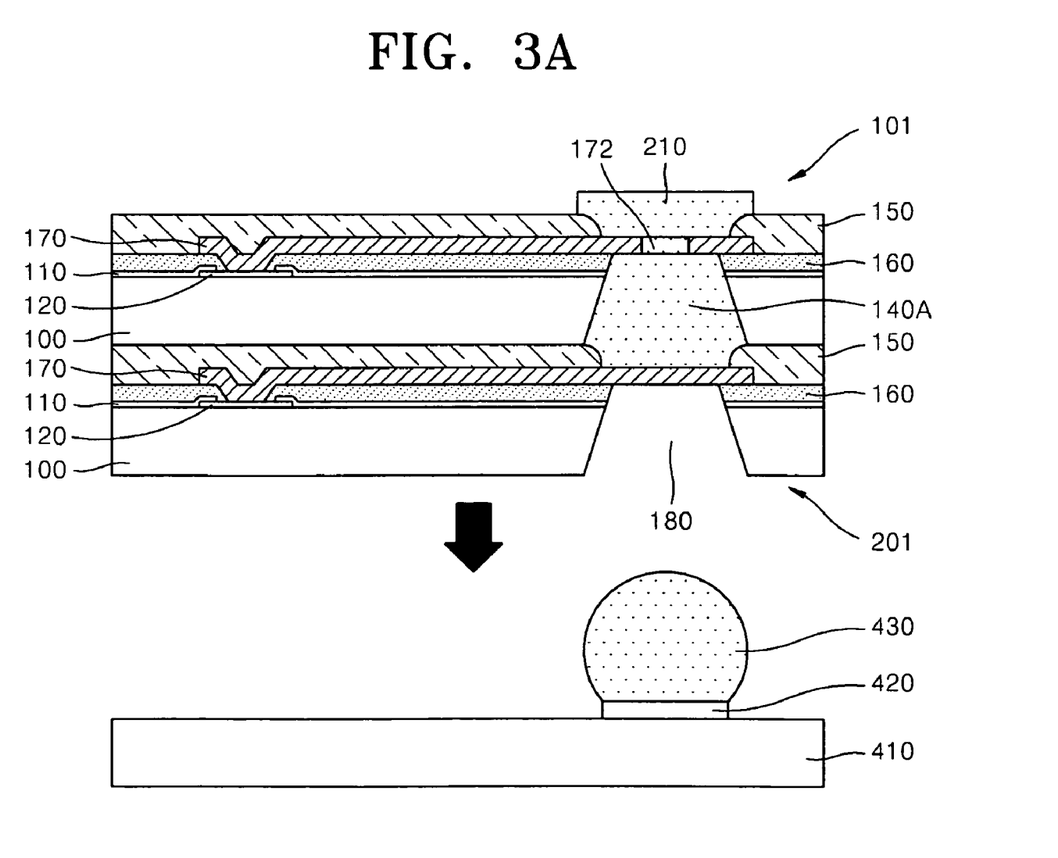
FIGS. 3A and 3B are cross-sectional views for describing a method of mounting the COC semiconductor device illustrated in FIG. 1 on a printed circuit board (PCB), according to example embodiments.
Figure 3B:
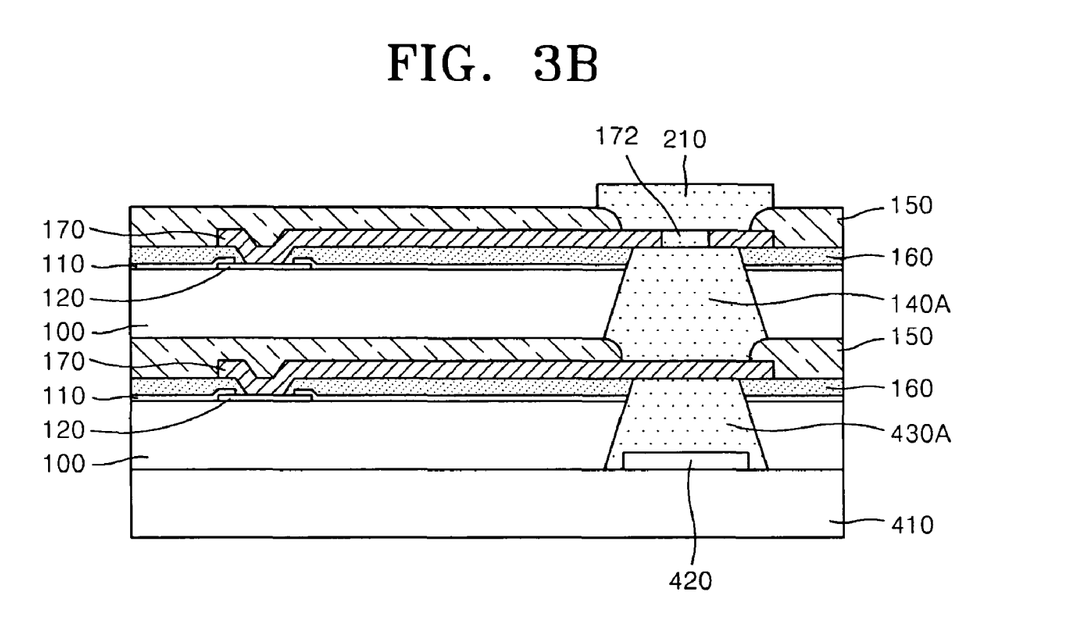

FIGS. 3A and 3B are cross-sectional views for describing a method of mounting the COC semiconductor device illustrated in FIG. 1 on a printed circuit board (PCB) 410, according to example embodiments. Referring to FIGS. 3A and 3B, the COC semiconductor device may be mounted on the PCB 410. A recess region 180 may be formed in the second semiconductor device 201 below the pad arrangement pattern 170 of the second semiconductor device 201. The recess region 180 formed in the second semiconductor device 201 may be formed below the bump 140a electrically connecting the first semiconductor device 101 to the second semiconductor device. A bump 430 may be attached onto a connection pad 420 of the PCB 410, wherein the bump 430 may be plugged into the recess region 180 of the second semiconductor device 201 by using self alignment.

The COC semiconductor device may be aligned so as to be mounted on the PCB 410 by using eutectic bonding, and thus, the bump 430 of the PCB 410 may be melted to be plugged into the recess region 180 of the second semiconductor device 201. Thus, the PCB 410 may be electrically connected to the second semiconductor device 203. If necessary, a sealing resin may be further deposited in order to seal the first and second semiconductor devices 101 and 201. In addition, an external connection terminal, for example, a solder ball, may be attached onto a lower portion of the PCB 410.

Figure 4A:
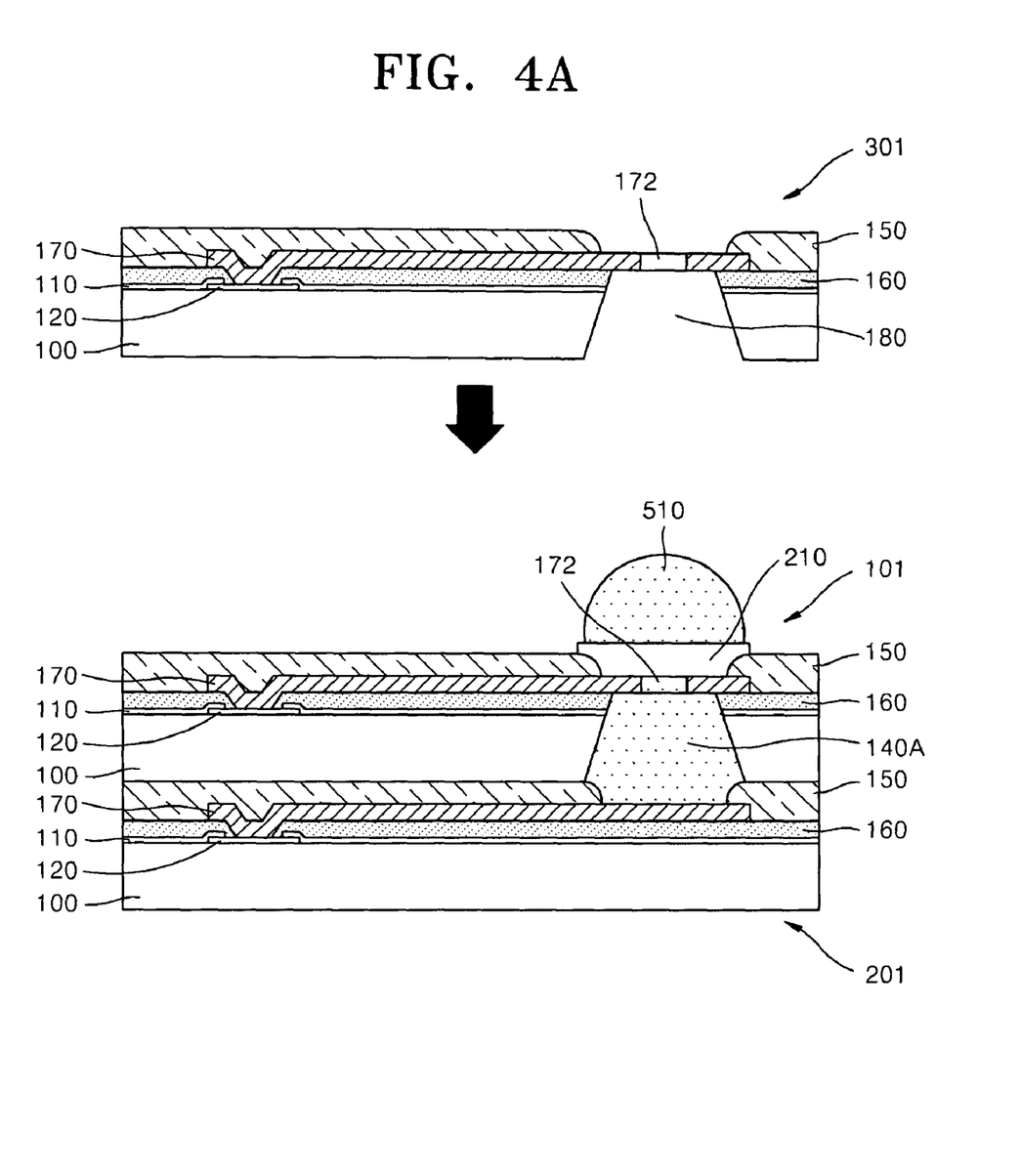
FIGS. 4A and 4B are cross-sectional views for describing a method of connecting a third semiconductor device onto the COC semiconductor device illustrated in FIGS. 1A through 1D, according to example embodiments.
Figure 4B:
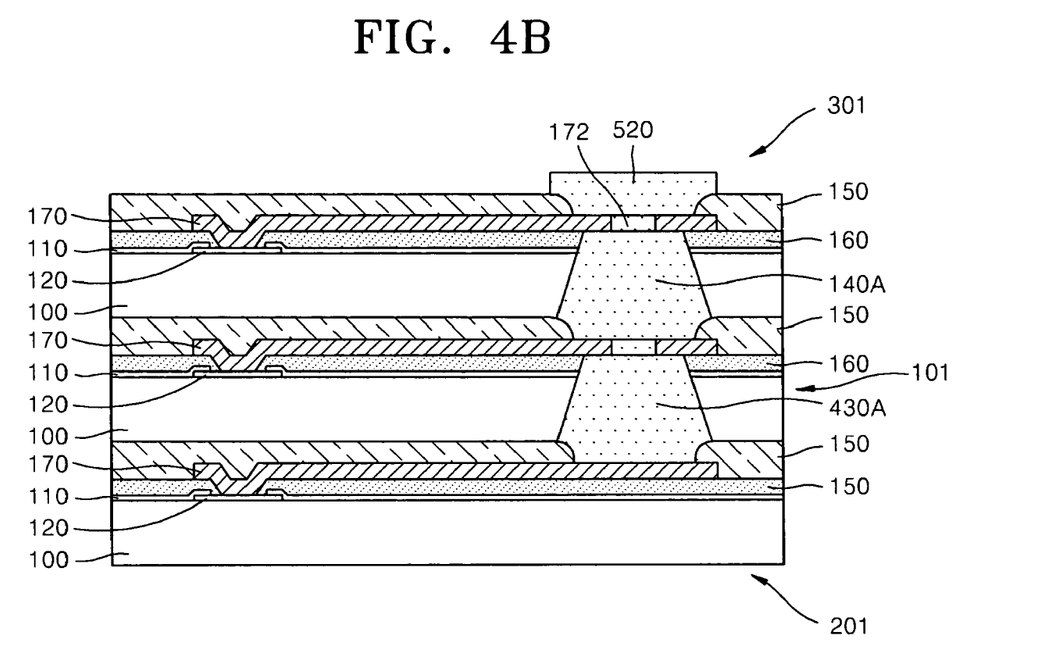

FIGS. 4A and 4B are cross-sectional views for describing a method of connecting a third semiconductor device 301 onto the COC semiconductor device illustrated in FIGS. 1A through 1D, according to example embodiments. According to example embodiments illustrated in FIGS. 1A through 1D, the COC semiconductor device may include only the first and second semiconductor devices 101 and 201 that may be stacked. However, the COC semiconductor device may include at least three stacked semiconductor devices.

In example embodiments, first and second semiconductor devices 101 and 201 may be stacked and a bump 510 may be formed on a bump pad 210 of the first semiconductor device 101. A third semiconductor device 301 may be prepared similarly to the first semiconductor device 101 and the second semiconductor device 201. According to example embodiments, the third semiconductor device 301 may include discontinuous spot 172 in a pad-rearrangement pattern 170. According to example embodiments, the third semiconductor device 301 may further include a recess region 180 below the pad rearrangement pattern 170. The configuration and manufacturing method of the third semiconductor device 301 may be the same as the method of manufacturing for the first and second semiconductor devices 101 and 201.

The third semiconductor device 301 and the first semiconductor device 101 on which the bump 510 is formed may be aligned with each other and coupled via eutectic bonding. Thus, the bump 510 formed on the first semiconductor device 101 may be plugged into the recess region 180 of the third semiconductor device 301, and the bump 510 may be melted to fill the recess region 180, thereby completing the electrical connection of the pad-rearrangement pattern 170 having the discontinuous spot 172 of the third semiconductor device 301. A part of the bump 510, which is melted using eutectic bonding, may expand above the discontinuous spot 172 of the third semiconductor device 301 and may form a new bump pad 520. Thus, a COC semiconductor device including at least three stacked semiconductor devices may be manufactured.

Figure 5:
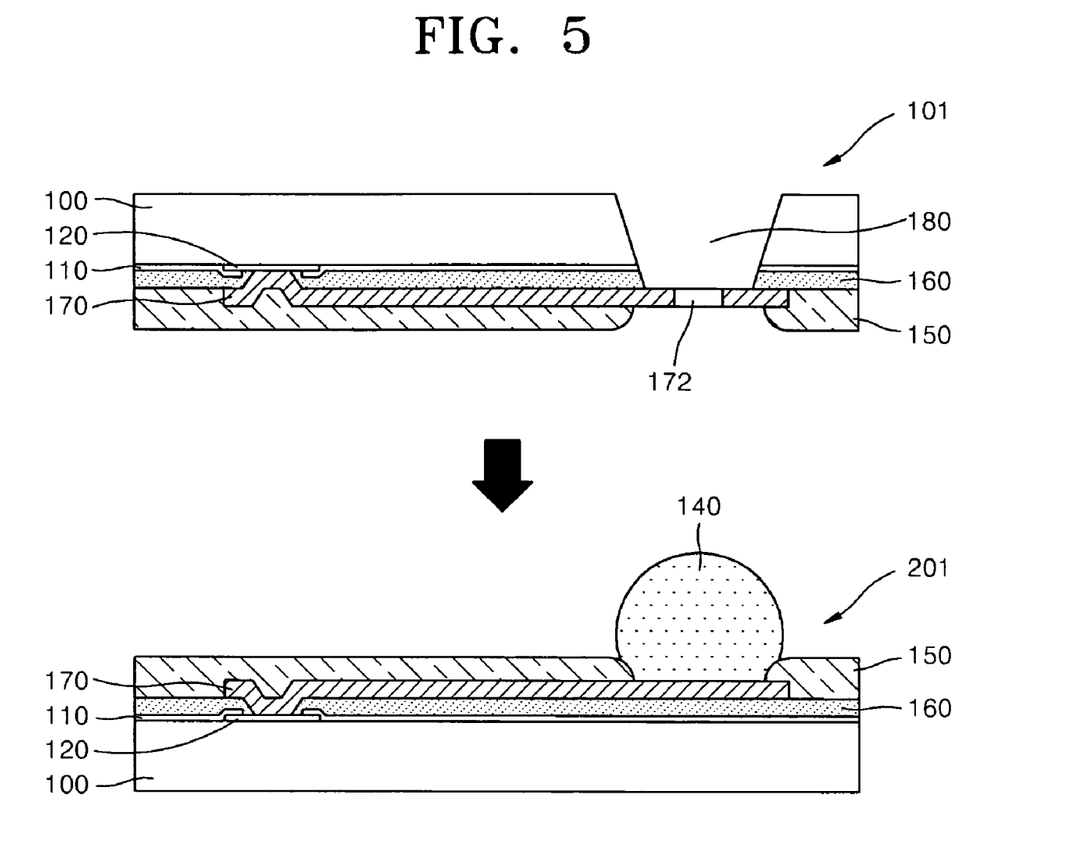
FIG. 5 is a cross-sectional view for describing a method of manufacturing a COC semiconductor device, according to example embodiments.

FIG. 5 is a cross-sectional view for describing a method of manufacturing a COC semiconductor device, according to example embodiments. In FIG. 1, the first semiconductor device 101 and the second semiconductor device 201 may be coupled in a direction so that the bump 140 of the second semiconductor device 201 is plugged into the recess region 180 of the first semiconductor device 101. However, referring to FIG. 5, the first semiconductor device 101 and the second semiconductor device 201 may be coupled so that the bump 140 of the second semiconductor device 201 may come in contact with the discontinuous spot 172 of the pad-rearrangement pattern 170 included in the first semiconductor device 101.

Thus, the bump 140 of the second semiconductor device 201, which may be melted using eutectic bonding, may be electrically connected to the pad-rearrangement pattern 170 having the discontinuous spot 172 included in the first semiconductor device 101 when filing the recess region 180 formed in a back surface of the semiconductor substrate 100.

According to example embodiments, a metal wiring having a discontinuous spot disposed in a recess region of an upper semiconductor device (e.g., a first wafer) may be directly connected to a bump formed on a lower semiconductor (e.g., a second wafer), thereby manufacturing a COC semiconductor device.

Accordingly, because upper and lower semiconductor devices may be directly coupled to each other without an intermediary medium, e.g., a wire or an interposer, a signal may be transferred between semiconductor chips at increased speeds, thereby improving the operational frequency characteristics of a COC semiconductor chip. Many connection terminals may be connected in a vertical direction in a semiconductor chip because a relatively small-sized bump may be used and upper and lower semiconductor devices may be coupled via a recess region formed below a bump pad of the semiconductor chip.

Because a pad-rearrangement metal wiring, which generates a relatively large amount of heat, directly radiates the heat to the outside of a semiconductor device via a bump, a heat radiation path may be reduced, thereby improving the heat radiation characteristic of a COC semiconductor device.

A connection terminal, e.g. a bump, may be plugged into an upper semiconductor device in a COC semiconductor device, and thus, the thickness of the COC semiconductor device may be reduced. Accordingly, many semiconductor chips may be embedded in a COC semiconductor package.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of fabricating a chip-on-chip (COC) semiconductor device, the method comprising:
   preparing a first semiconductor device, the first semiconductor device including a metal wiring having at least one discontinuous spot formed therein, the preparing the first semiconductor device including forming at least one recess region in a substrate of the first semiconductor device below the at least one discontinuous spot;
   preparing a second semiconductor device, the second semiconductor device including at least one bump, wherein the at least one bump is formed on a surface of the second semiconductor device and the at least one bump corresponds to the at least one discontinuous spot;
   aligning the first semiconductor device onto the second semiconductor device; and
   connecting the at least one bump of the second semiconductor device to the at least one discontinuous spot formed in the metal wiring of the first semiconductor device.

2. The method of claim 1, wherein preparing the first semiconductor device includes forming the at least one discontinuous spot in a bump pad of the metal wiring.

3. The method of claim 1, wherein aligning the first semiconductor device onto the second semiconductor device includes inserting the at least one bump of the second semiconductor device into the at least one recess region of the first semiconductor device.

4. The method of claim 1, wherein aligning the first semiconductor device onto the second semiconductor device includes aligning the at least one bump of the second semiconductor device over the at least one discontinuous spot formed in the metal wiring of the first semiconductor device.

5. The method of claim 1, wherein preparing the first semiconductor device includes grinding a bottom surface of the first semiconductor device.

6. The method of claim 1, wherein forming the at least one recess region of the first semiconductor device includes forming the at least one recess region of the first semiconductor device greater than the at least one discontinuous spot formed in the metal wiring.

7. The method of claim 1, wherein the first and second semiconductor devices are semiconductor devices performing the same function.

8. The method of claim 1, wherein the first and second semiconductor devices are semiconductor devices performing different functions.

9. The method of claim 1, wherein forming the at least one recess region of the first semiconductor device includes using one selected from wet etching, dry etching, and laser etching.

10. The method of claim 1, wherein preparing the first semiconductor device includes forming a dummy pattern on a region of the first semiconductor device adjacent to the at least one discontinuous spot formed in the metal wiring of the first semiconductor device.

11. The method of claim 1, wherein connecting the at least one bump of the second semiconductor device to the at least one discontinuous spot formed in the metal wiring of the first semiconductor device includes connecting the at least one bump of the second semiconductor device to the at least one discontinuous spot formed in the metal wiring of the first semiconductor device via eutectic bonding.

12. The method of claim 1, wherein
   preparing the first semiconductor device includes forming the at least one discontinuous spot in a bump pad of the metal wiring, and
   connecting the at least one bump of the second semiconductor device to the at least one discontinuous spot formed in the metal wiring of the first semiconductor device includes filling the at least one recess region of the first semiconductor device with melted bump material by melting the at least one bump of the second semiconductor device to fill the at least one recess region such that the melted material expands above the bump pad in which the at least one discontinuous spot is formed.

13. The method of claim 1, wherein forming the at least one recess region of the first semiconductor device includes forming the at least one recess region in one shape selected from a rectangular shape, a conic shape and a cylindrical shape.

14. The method of claim 1, wherein forming the at least one bump on the second semiconductor device further comprises:
   forming a under bump metal (UBM) layer on a bump pad;
   forming a seed layer on the UBM layer; and
   forming a bump layer on the seed layer.

15. The method of claim 1, wherein
   preparing the second semiconductor device further includes forming at least one recess region in the substrate of the second semiconductor device below the at least one bump,
   preparing the first semiconductor device includes forming the at least one discontinuous spot in a bump pad of the metal wiring, and
   connecting the at least one bump of the second semiconductor device to the at least one discontinuous spot formed in metal wiring of the first semiconductor device includes connecting the at least one recess region of the first semiconductor device to the at least one bump of the second semiconductor device.

16. The method of claim 15, further comprising:
   forming a bump on the bump pad in which the at least one discontinuous spot of the first semiconductor device is formed after connecting the at least one recess region of the first semiconductor device to the at least one bump of the second semiconductor device,
   preparing a third semiconductor device including a metal wiring and a recess region formed below the metal wiring, wherein the metal wiring has a bump pad in which a discontinuous spot is formed; and
   connecting the bump included on the first semiconductor device to the recess region of the third semiconductor device.

17. The method of claim 15, after connecting the at least one recess region of the first semiconductor device to the at least one bump of the second semiconductor device, further comprising:
   separating a COC semiconductor chip by cutting the first and second semiconductor devices, wherein the first and second semiconductor devices are first and second wafers;
   preparing a printed circuit board (PCB) including at least one bump attached to a surface of the PCB and corresponding to the at least one recess region of the second wafer; and connecting the at least one recess region of the second semiconductor device to the at least one bump of the PCB.

18. The method of claim 1, wherein the first semiconductor device is a first wafer and the second semiconductor device is a second wafer.

19. The method of claim 1, wherein the first semiconductor device is a first semiconductor chip and the second semiconductor device is a second semiconductor chip.

20. The method of claim 1, wherein the at least one discontinuous spot is an opening which penetrates a thickness of the metal wiring.

21. The method of claim 1, wherein connecting the at least one bump of the second semiconductor device to the at least one discontinuous spot includes expanding a portion of the at least one bump from a first side of the metal wiring through the at least one discontinuous spot and over a second side of the metal wiring.

* * * * *